United States Patent
Makosinski et al.

(10) Patent No.: US 9,723,659 B2
(45) Date of Patent: Aug. 1, 2017

(54) THERMOELECTRICALLY POWERED PORTABLE LIGHT SOURCE

(71) Applicants: Ann Makosinski, Victoria (CA); Arthur Makosinski, Victoria (CA)

(72) Inventors: Ann Makosinski, Victoria (CA); Arthur Makosinski, Victoria (CA)

(73) Assignee: MAKOTRONICS ENTERPRISES INC., Victoria (CA)

( * ) Notice: Subject to any disclaimer, the term of this patent is extended or adjusted under 35 U.S.C. 154(b) by 69 days.

(21) Appl. No.: 14/991,740

(22) Filed: Jan. 8, 2016

(65) Prior Publication Data

US 2016/0128141 A1   May 5, 2016

Related U.S. Application Data

(63) Continuation-in-part of application No. PCT/IB2014/060634, filed on Apr. 11, 2014.
(Continued)

(51) Int. Cl.
*H05B 33/08* (2006.01)
*H05B 37/02* (2006.01)
(Continued)

(52) U.S. Cl.
CPC .......... *H05B 33/0803* (2013.01); *F21L 13/00* (2013.01); *H01L 35/30* (2013.01);
(Continued)

(58) Field of Classification Search
None
See application file for complete search history.

(56) References Cited

U.S. PATENT DOCUMENTS

| 5,288,336 A | 2/1994 | Strachan et al. |
| 2002/0145869 A1 | 10/2002 | Dowling |

(Continued)

FOREIGN PATENT DOCUMENTS

| DE | 202013009160 U1 * | 12/2013 | .............. F21L 13/00 |
| JP | 2001229718 A * | 8/2001 | |
| JP | 2001229718 A | 8/2001 | |

OTHER PUBLICATIONS

"The Hollow (Thermoelectric) Flashlight ? Google Science Fair"; YouTube ID : "Queenie Andini"; http://www.youtube.com/watch?v=9CCGUMkobjg ; Apr. 30, 2013.
(Continued)

*Primary Examiner* — Jany Richardson
(74) *Attorney, Agent, or Firm* — Perry + Currier Inc.

(57) ABSTRACT

Provided is a portable, thermoelectrically powered device, such as a flashlight or headlamp. The device comprises at least one thermoelectric generator for extracting body heat from a user, the Thermoelectric generator located on and extending through an elongated open ended outer shell, a heat sink in contact with an inner surface of the thermoelectric generator and configured to provide an elongated first cooling channel therethrough, circuitry in electrical communication with the thermoelectric generator, the circuitry comprising a transistor oscillator, a step-up transformer and a decoupling capacitor, the circuitry in electrical communication with a power sink, such that in use, a temperature gradient across the thermoelectric generator is sufficient to result in generation of at least about 25 µW of power.

20 Claims, 13 Drawing Sheets

Related U.S. Application Data

(60) Provisional application No. 61/845,344, filed on Jul. 11, 2013.

(51) Int. Cl.

| | | |
|---|---|---|
| *F21L 13/00* | (2006.01) | |
| *H01L 35/30* | (2006.01) | |
| *H01L 35/32* | (2006.01) | |
| *H02J 7/32* | (2006.01) | |
| *F21V 21/084* | (2006.01) | |
| *F21Y 115/10* | (2016.01) | |

(52) U.S. Cl.
CPC ......... *H01L 35/32* (2013.01); *H05B 33/0815* (2013.01); *H05B 37/02* (2013.01); *F21V 21/084* (2013.01); *F21Y 2115/10* (2016.08); *H02J 7/32* (2013.01)

(56) References Cited

U.S. PATENT DOCUMENTS

2013/0137957 A1* 5/2013 Wood .................. A61B 5/0408
　　　　　　　　　　　　　　　　　　　　　　600/391
2015/0267998 A1* 9/2015 Grace, Jr. .............. F41G 1/467
　　　　　　　　　　　　　　　　　　　　　　42/117

OTHER PUBLICATIONS

International Preliminary Report on Patentabiltiy dated Jan. 12, 2016 for PCT Application No. PCT/IB2014/060634.
"Girl invents "Hollow" Flashlight ? Shaw TV Victoria"; YouTube ID: "ShawTVSouthVI"; http://www.youtube.com/watch?v=DLECJbWrKrs; Jul. 10, 2013.
International Search Report dated Jun. 27, 2014 for PCT International Application No. PCT/IB2014/060634.
Written Opinion dated Jun. 27, 2014 for PCT International Application No. PCT/IB2014/060634.

* cited by examiner

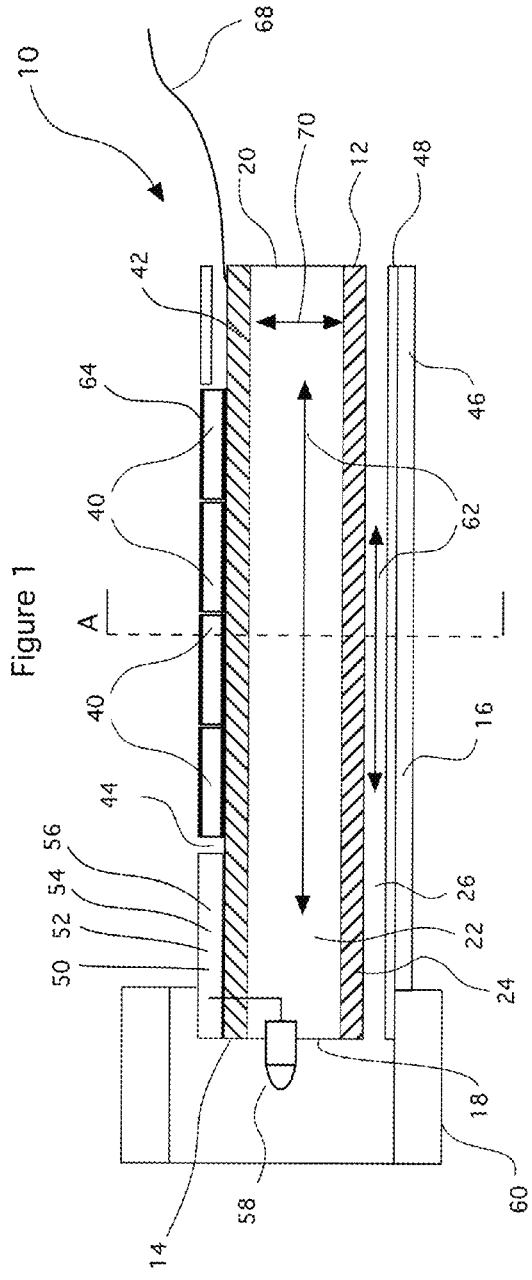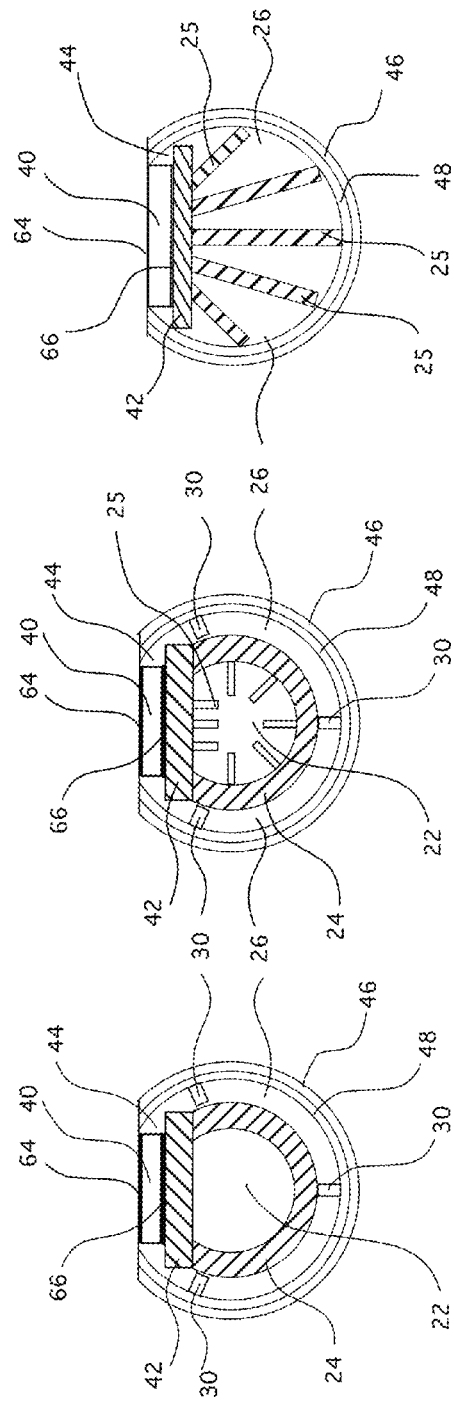

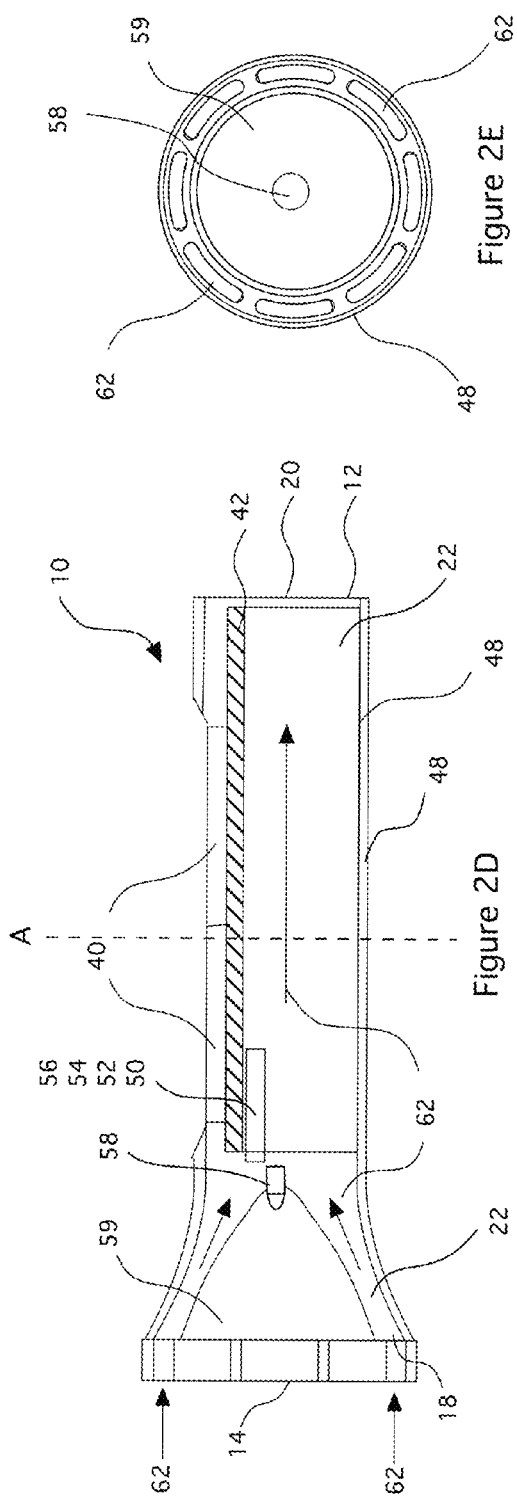
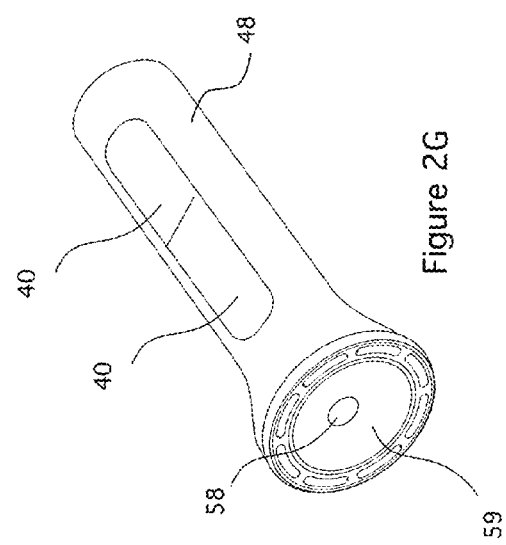

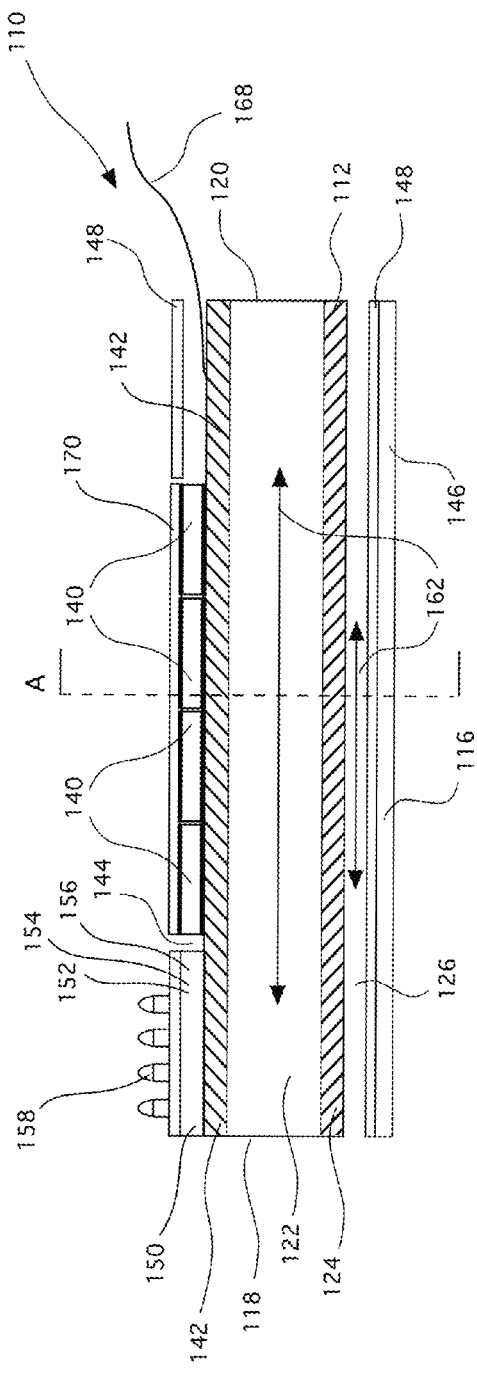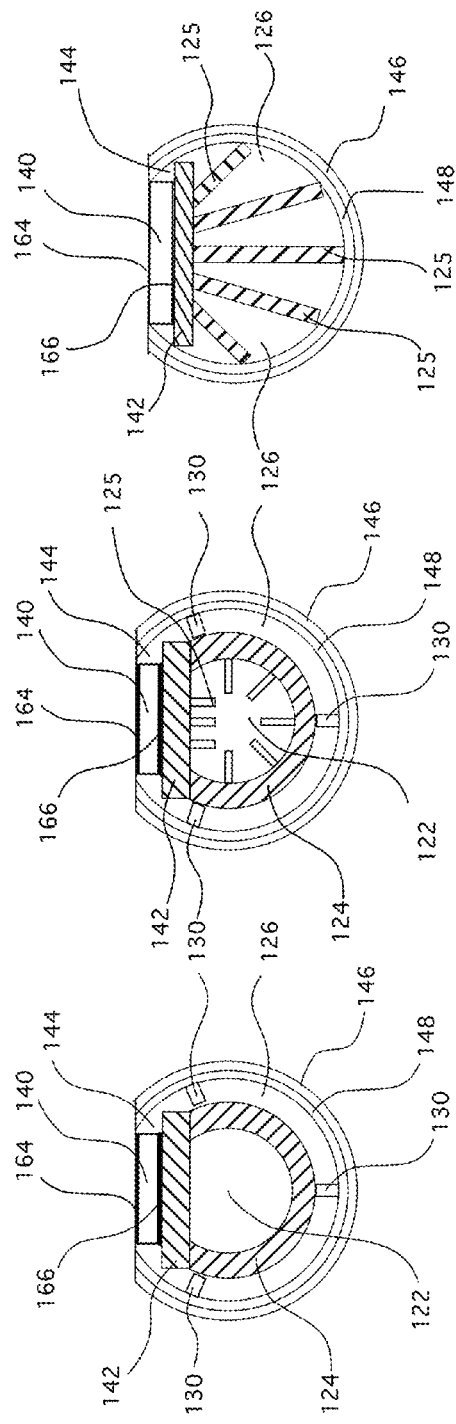

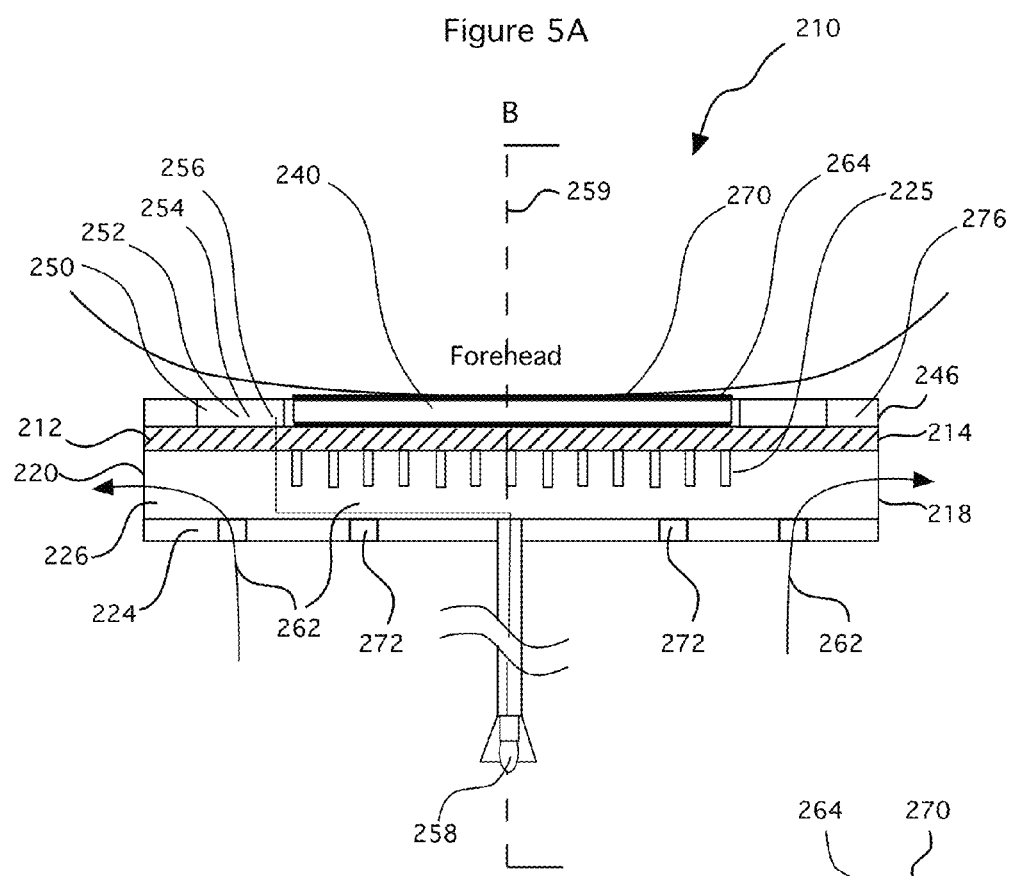

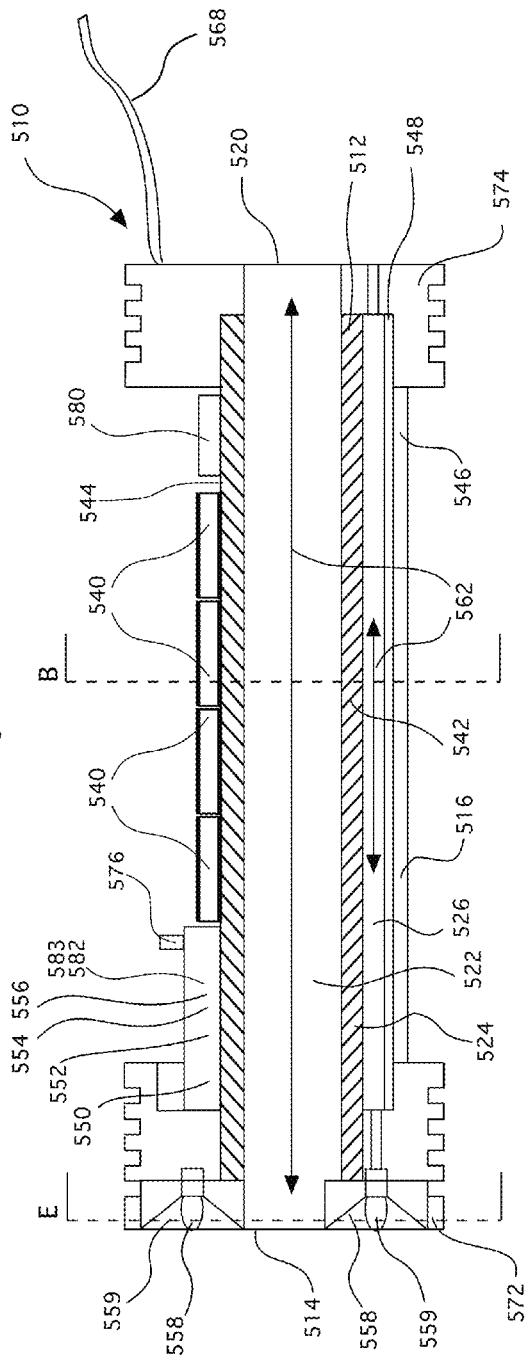
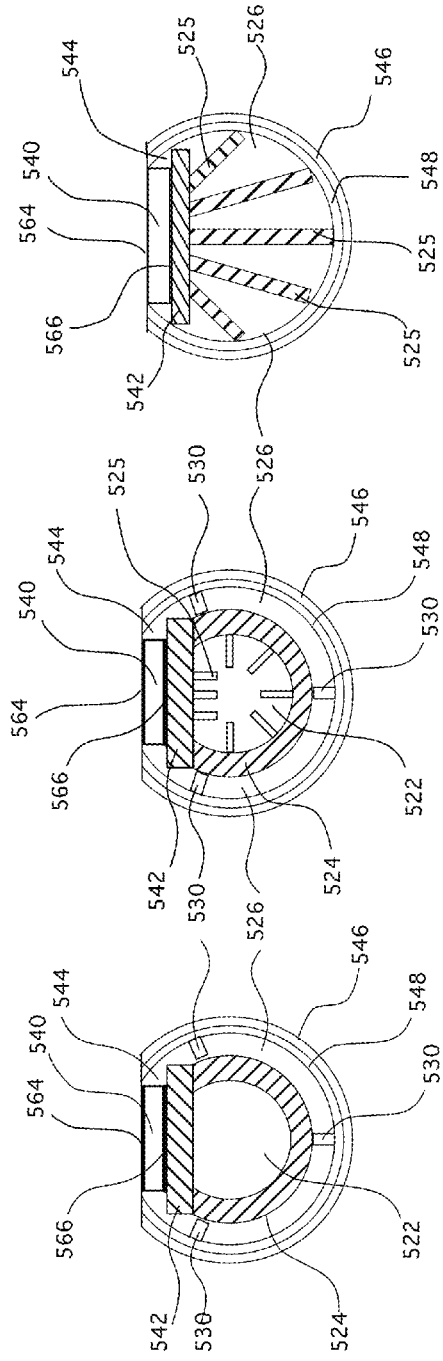
Figure 8A
Figure 8B
Figure 8C
Figure 8D

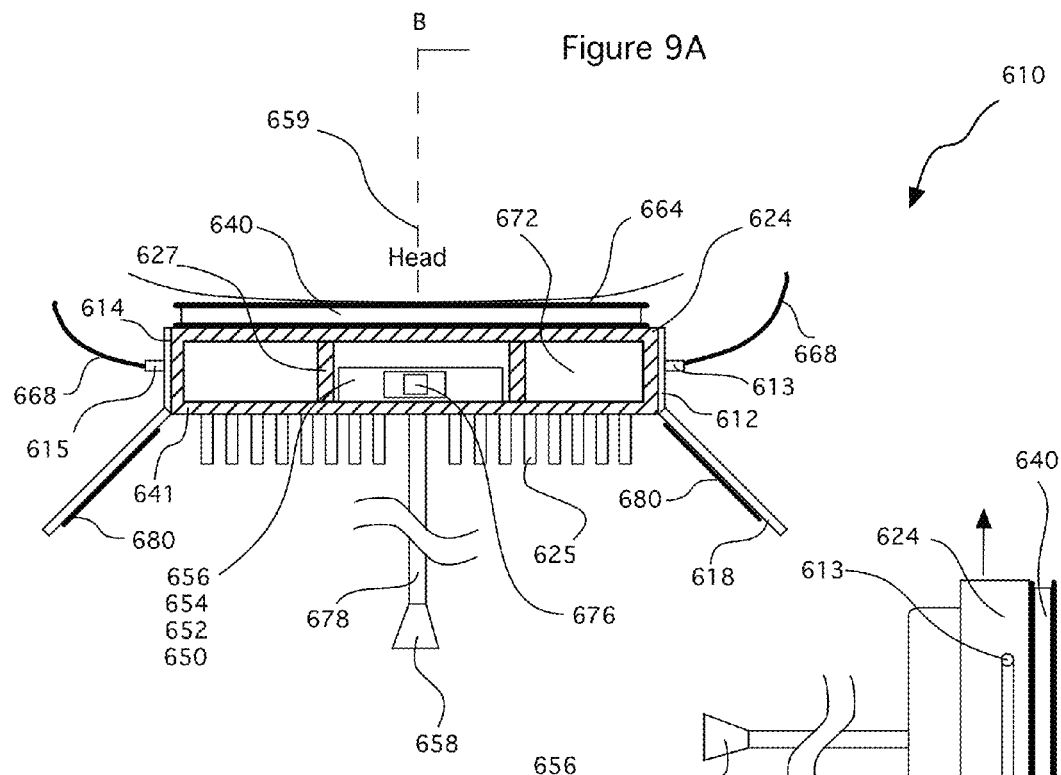
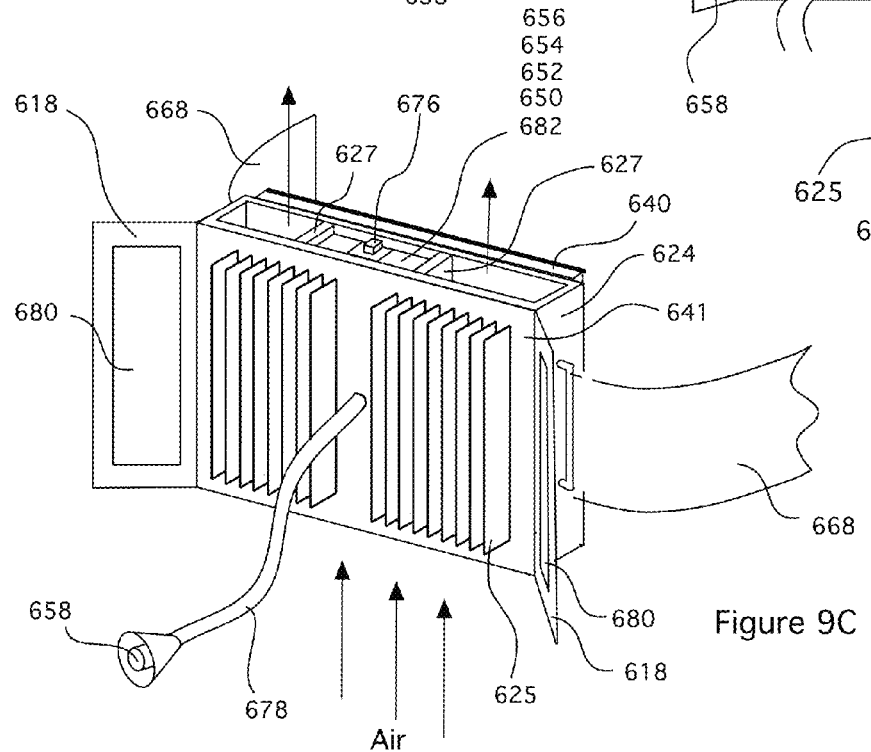

THERMOELECTRICALLY POWERED PORTABLE LIGHT SOURCE

CROSS-REFERENCE TO RELATED APPLICATIONS

This application is a continuation-in-part of PCT/IB2014/060634, filed Apr. 11, 2014, which is incorporated herein by reference.

BACKGROUND OF THE INVENTION

Field of the Invention

The present technology is a lighting system that relies on thermoelectricity for power. More specifically, it is a flashlight that is powered from body heat.

Description of the Related Art

Portable light sources such as head lamps and flashlights rely on a power source that is independent of the grid. Often, these light sources are used irregularly, are needed in emergency situations and if powered by batteries, tend to not work when needed as the batteries have died. Even if rechargeable batteries are used, charged batteries must be available when those powering the light source die. As a result, alternative designs have been developed that provide a ready power source.

Hand crank dynamos have been used both in lights and in portable cell phone rechargers. One such design, called the Sidewinder, is voltage regulated to keep the voltage reasonably stable even if the generator speed varies. This Sidewinder also includes a miniature flashlight capability. There is a white Light Emitting Diode (LED) on the top of the unit, and when the hand crank is turned, the generated power can either be used to recharge a cell phone or to turn on the light. A built in capacitor stores some charge so the light will continue to glow for a couple of minutes after a thirty second charge. The Preparedness Center (Ukiah, Calif.) markets a solar powered, hand crank powered flashlight and AM/FM radio. Safety Buddy, Inc. (Irvine, Calif.) markets a hand crank AM/FM dynamo radio with a lantern light. Unfortunately, the hand crank devices tend to have a short life span, are difficult to use in situations where the user is trying to focus the light on a specific location, for example when trying to unlock a door and they cannot be hands free.

It is known that thermoelectric generators such as Peltier modules, working on the Seebeck Principle, can be used to produce electric current. The Seebeck Effect states that electric current is produced when two dissimilar metals (such as bismuth and telluride) are joined, and one side of their junction is cooled while the other is heated. As in U.S. Pat. No. 7,626,114 a thermoelectric power supply converts thermal energy into a high power output with voltages in the Volt-range for powering a microelectronic device and comprises an in-plane thermoelectric generator, a cross-plane thermoelectric generator, an initial energy management assembly, a voltage converter and a final energy management assembly.

There exists a need to provide a portable light source that can be powered thermoelectrically, using thermoelectric generators. This would remove the requirement for batteries, toxic chemicals or kinetic energy and would provide a flashlight that does not create any noise or vibrations. An additional goal would be to provide a hands free flashlight. The power source could similarly be employed for other portable devices having power requirements that are the same or lower than a flashlight.

SUMMARY OF THE INVENTION

The present technology provides a portable, thermoelectrically powered device that relies on body heat from the user. In one embodiment, the device is a light source. The light source can be hand-held, wrist, arm, foot, leg, waist, head-mounted or otherwise in contact with the user's body.

The device is may be switchless and is triggered to turn on simply by the user's body heat.

In another embodiment, a switch is incorporated as a choice to power the light source either directly from the circuitry, or from a storage source such as a supercapacitor or rechargeable battery. In both cases, the storage source would be charged from the energy developed by the body heat.

In one embodiment, a portable, thermoelectrically powered device is provided, the device comprising: an at least one thermoelectric generator for extracting body heat from a user, the thermoelectric generator located on and extending through an elongated outer shell; a heat sink in contact with an inner surface of the thermoelectric generator, the heat sink configured to provide an elongated first cooling channel therethrough terminating at a first end and a second end with an at least one heat sink first aperture and an least one heat sink second aperture; and circuitry in electrical communication with the thermoelectric generator, the circuitry comprising a decoupling capacitor, a transistor oscillator, a step-up transformer and, the circuitry in electrical communication with a power sink, such that in use, a temperature gradient across the thermoelectric generator is sufficient to result in generation of at least 25 microwatts of power.

In the portable thermoelectrically powered device, the step-up transformer may be further defined as an about 25:1 to about a 500:1 step-up transformer.

In the portable thermoelectrically powered device, the heat sink may have a thermal conductivity of at least about 16 W/mK at 25° C.

In the portable thermoelectrically powered device, the device comprises the outer shell, the outer shell having a first end and a second end and a bore therebetween, the first end defining an at least one aperture and the second end defining an at least one aperture and further comprises an insulating layer adjacent the outer shell.

In the portable thermoelectrically powered device the heat sink may be aluminum, copper, steel, stainless steel or pyrolytic graphite or a diamond coated substrate.

The portable thermoelectrically powered device may further comprise a second cooling channel between the heat sink and the outer shell and struts for supporting the inner cylinder in the outer shell.

In the portable thermoelectrically powered device the power sink may be at least one LED and the device is a light source.

In the portable thermoelectrically powered device the light source may be a head lamp or a flashlight.

In the portable thermoelectrically powered device, the light source may be a flashlight.

In the portable thermoelectrically powered device the capacitor may be an about 47 µF capacitor.

In another embodiment, a thermoelectrically powered light is provided, the light comprising: at least one thermoelectric generator for extracting body heat from a user; a first end and a second end, the first end and second end defining an at least one first aperture and an at least one second aperture, respectively; a heat sink in contact with an inner surface of the thermoelectric generator and defining an elongated first cooling channel; and circuitry in electrical communication with the thermoelectric generator, the circuitry comprising an a decoupling capacitor, a transistor oscillator, step-up transformer and the circuitry in electrical communication with an at least one light emitting diode (LED).

The thermoelectrically powered light may further comprising a body including an insulating layer and a supporting layer and defining a bore extending between the at least one first and at least one second apertures; the thermoelectric generator located on and extending through the body and the heat sink housed in the bore.

In the thermoelectrically powered light the heat sink may have a thermal conductivity of at least about 16 W/mK at 25° C.

In the thermoelectrically powered light, the heat sink may be an aluminum, copper, steel, stainless steel, pyrolytic graphite or diamond coated inner cylinder.

The thermoelectrically powered light may further comprising a second cooling channel between the heat sink and the body, and struts for supporting the heat sink in the body.

In the thermoelectrically powered light the step-up transformer may be further defined as an about 25:1 to about a 500:1 step-up transformer.

In the thermoelectrically powered light, the capacitor across the thermoelectric generator may be an about 47 (or more) µF capacitor.

In the thermoelectrically powered light, the light may be a headlamp or a flashlight.

A method of providing light is also provided, the method comprising: a user holding or pressing a thermoelectrically powered flashlight or body lamp against their body such that the body contacts an at least one thermoelectric generator of the flashlight or body light, the flashlight or body lamp comprising: the at least one thermoelectric generator; a heat sink in contact with an inner surface of the thermoelectric generator; and circuitry in electrical communication with the thermoelectric generator, the circuitry comprising a capacitor, a transistor oscillator, step-up transformer, the circuitry in electrical communication with an at least one LED; the thermoelectric generator extracting body heat from the user; the heat sink removing body heat from the thermoelectric generator; the thermoelectric generator producing heat energy; and the circuitry communicating an electric current to the at least one LED, thereby providing a steady or a flashing light.

The method may further comprise storing the heat energy as a charge in a capacitor or battery of the flashlight or body light.

The method may further comprise releasing the charge as the electric current.

BRIEF DESCRIPTION OF THE DRAWINGS

FIG. 1 is medial longitudinal sectional view of the flashlight of the present technology.

FIGS. 2A, 2B and 2C are cross sectional views of the technology of FIG. 1 taken at line A in FIG. 1.

FIGS. 2D-2G show an alternate embodiment of FIG. 1, with FIG. 2F being a cross-sectional view taken at line A and FIG. 2G being a perspective view of this embodiment.

FIG. 3 is a medial longitudinal view of an alternative embodiment of FIG. 1.

FIGS. 4A, 4B and 4C are cross sectional views of the technology of FIG. 3 taken at line A.

FIG. 5A is a medial longitudinal view of a headlamp of the present technology. FIG. 5B is a cross sectional view of FIG. 5A taken at line B. FIG. 5C is a perspective view of FIG. 5A.

FIGS. 5A, 5B and 5C show an alternative embodiment of the headlamp of the present technology.

FIGS. 8A-8G show an alternative embodiment of the flashlight of the present technology. FIGS. 8B, 8C and 8D are cross sectional views taken at line B in FIG. 8A. FIG. 8E is a cross sectional view taken at line E in FIG. 8A. FIG. 8F is a side view of 572, and FIG. 8G is the same side view but with a flexible solar cell around on 572.

FIGS. 9A-9C show an alternative embodiment of the headlamp of the present technology. FIG. 9A is a medial longitudinal view. FIG. 9B is a cross sectional view of FIG. 9A taken at line B. FIG. 9C is a perspective view of FIG. 9A.

DETAILED DESCRIPTION OF THE PREFERRED EMBODIMENTS

Figure 6A:
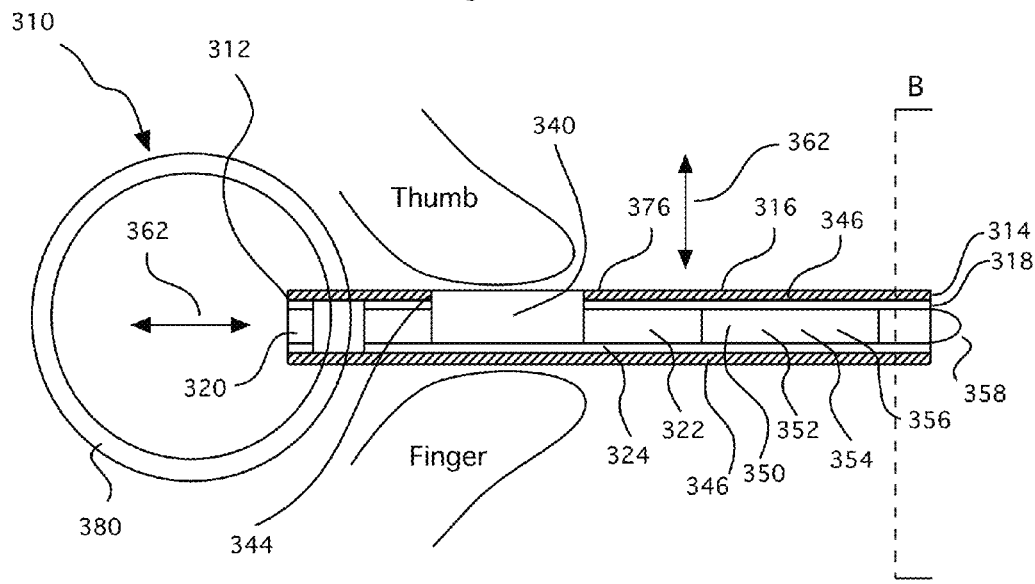
FIGS. 6A-6C show a keychain flashlight of the present technology.

Except as otherwise expressly provided, the following rules of interpretation apply to this specification (written description, claims and drawings): (a) all words used herein shall be construed to be of such gender or number (singular or plural) as the circumstances require; (b) the singular terms "a", "an", and "the", as used in the specification and the appended claims include plural references unless the context clearly dictates otherwise; (c) the antecedent term "about" applied to a recited range or value denotes an approximation within the deviation in the range or value known or expected in the art from the measurements method; (d) the words "herein", "hereby", "hereof", "hereto", "hereinbefore", and "hereinafter", and words of similar import, refer to this specification in its entirety and not to any particular paragraph, claim or other subdivision, unless otherwise specified; (e) descriptive headings are for convenience only and shall not control or affect the meaning or construction of any part of the specification; and (f) "or" and "any" are not exclusive and "include" and "including" are not limiting. Further, The terms "comprising," "having," "including," and "containing" are to be construed as open-ended terms (i.e., meaning "including, but not limited to,") unless otherwise noted.

To the extent necessary to provide descriptive support, the subject matter and/or text of the appended claims is incorporated herein by reference in their entirety.

Recitation of ranges of values herein are merely intended to serve as a shorthand method of referring individually to each separate value falling within the range, unless otherwise indicated herein, and each separate value is incorporated into the specification as if it were individually recited herein. Where a specific range of values is provided, it is understood that each intervening value, to the tenth of the unit of the lower limit unless the context clearly dictates otherwise, between the upper and lower limit of that range and any other stated or intervening value in that stated range, is included therein. All smaller sub ranges are also included. The upper and lower limits of these smaller ranges are also included therein, subject to any specifically excluded limit in the stated range.

Unless defined otherwise, all technical and scientific terms used herein have the same meaning as commonly understood by one of ordinary skill in the relevant art. Although any methods and materials similar or equivalent to those described herein can also be used, the acceptable methods and materials are now described.

All methods described herein can be performed in any suitable order unless otherwise indicated herein or otherwise clearly contradicted by context. The use of any and all examples, or exemplary language (e.g., "such as") provided herein, is intended merely to better illuminate the example embodiments and does not pose a limitation on the scope of the claimed invention unless otherwise claimed. No language in the specification should be construed as indicating any non-claimed element as essential.

In the context of the present technology, body refers to any part of a mammal and user similarly refers to a mammal.

A flashlight, generally referred to as 10 is shown in FIG. 1. The flashlight 10 has the dimensions of a typical flashlight. The flashlight 10 has a proximal end 12, a distal end 14 and a body 16 therebetween. The distal end 14 defines a distal aperture 18 and the proximal end 12 defines a proximal aperture 20. Housed within the body 16 is an inner cylinder 24 defining a first cooling channel 22 and a second cooling channel 26 between the body 16 and the inner cylinder 24. There are cooling fins 25 in the first cooling channel 22 (See FIGS. 2B and C). Notwithstanding the size recited above, the first channel 22 has an inside diameter of about 12 mm to about 30 mm, or 15 mm to about 25 mm or about 18 mm to about 29 mm and all ranges therebetween. It is about 150 mm long. As shown in FIGS. 2A, 2B and 2C, there are struts 30 between the inner cylinder 24 and the body 16 to retain the inner cylinder 24. FIG. 2A is an alternative embodiment that does not include the cooling fins. The inner cylinder 24 is a heat conducting material, for example, but not limited to aluminum, copper, steel, stainless steel, diamond coated metal or diamond coated plastic polymer. It functions as a heat sink and has a thermal conductivity of at least about 16 W/mK at 25° C. or about 175 W/mK at 25° C. or about 205 W/mK at 25° C. or about 400 W/mK at 25° C., and all ranges therebetween. The inner cylinder 24 is about 1.2 mm thick, to about 5 mm thick, or about 3 mm thick and all ranges therebetween. The following is a list of the thermal conductivity of a number of potential materials: Stainless steel: Heat conduction 16 W/mK; Steel: Heat conduction 50 W/m K; Pyrolytic Graphite: Heat conduction 700-1750 W/m K, Silver: Heat conduction 400 W/m K, Copper: Heat conduction 385 W/m K, Aluminum: Heat conduction 205 W/m K and sandwiches including these and other materials.

Returning to FIG. 1 and FIGS. 2A and B, Peltier modules 40 are located on a plate 42 that is also a heat sink and is made of the materials listed above or has the functional capabilities listed above. Plate 42 and cylinder 24 can also be one single extrusion. The inner cylinder extrusion can also be open as in FIG. 2C, with cooling fins 25 acting also as support against the body 48. Four Peltier modules 40 are shown in FIG. 1. The plate 42 is located in a cutout (aperture) 44 in the body 16. This allows for contact with the Peltier modules 40. The body 16 may have at least one insulating layer 46 and one supporting layer 48, for example, but not limited to foam and a Poly Vinyl Chloride (PVC) shell, respectively. The shell is about 32 mm OD, and about 29 mm ID, which leaves a 1.5 mm air gap around the inner cylinder 24. The insulating layer 46 may be a 1.5 mm thick, rubber foam or other materials such as, but not limited to leather, fabric, or wood. The heat conductivity is low, possible less than 1 W/m/K.

Circuitry 50 is housed within the flashlight 10. The circuitry 50 has a transistor oscillator 52, with a 10:1 or 25:1 or 500:1 or preferably a 100:1, and all ranges therebetween, step-up transformer 54 to provide the required voltage and an about 47 μF decoupling capacitor 56, which may or may not be used. Alternatively, the circuitry may be an integrated circuit containing the transistor oscillator 52 and other components needed to generate DC or a pulsed DC power may be used. At least one LED 58 is located at the distal end 14 and is in electrical communication with the circuitry 50. The LED 58 is centrally located on the distal end 14, with or without a reflector, or, if multiple LEDs 58 are employed, they form a ring around the distal aperture 18. A focusing ring 60 is also located at the distal end 14.

As shown in FIG. 1, there is convective air flow 62 in both the first channel 22 and the second channel 26. This convective air flow 62 and the heat sink function to provide the necessary temperature differential across the Peltier modules 40, as described below.

In use, a user grasps the flashlight 10 such that their hand is on the Peltier module 40, more specifically, their palm. The temperature differential between the approximately 37° C. palm on the outer surface 64 of the Peltier module 40 and the inner surface 66 (FIG. 2A) of the Peltier module 40 generates sufficient power to light the LED 58, which appears from experimental results to be about a 5° C. temperature range or about 6.5° C. temperature range, or about a 7.5° C. temperature range or about a 10° C. temperature range or about a 15° C. temperature range. The device is switchless and is turned on by the user's body heat. As would be known to one skilled in the art, the temperature range needed can be calculated once the parameters of the tile are known.

A flashlight 10 can include a strap 68, as shown in FIG. 1, for releasably attaching to a user's arm. In this case, the arm would provide the 37° C. surface.

FIG. 2E shows the flashlight 10 in another layout, where the distal end 14 defines a distal aperture 18 which consists of several smaller apertures 62, and the proximal end 12 defines a proximal aperture 20. This allows for the inclusion of a larger reflector 59. Housed within the body 48 is a finned heat sink extrusion 42, which could have fins 25 at any angle to the flat part of 42 touching the thermoelectric generators, and defining a single cooling channel 22. Body 48 is made from an insulating material such as plastic, or wood, or any number of poor heat conductive materials with heat conductivity of 0.1 and 0.3 W/mK. It is shown here without the insulating layer 46.

The heat sink is made from a heat conducting material, for example, but not limited to aluminum, copper, steel, stainless steel, diamond coated metal or diamond coated plastic polymer. It has a thermal conductivity of at least about 16 W/mK at 25° C. or about 175 W/mK at 25° C. or about 205 W/mK at 25° C. or about 400 W/mK at 25° C., and all ranges therebetween. As shown in FIG. 2F, the extrusion heat sink fins 25 can touch the inner body 48 for support, as do the struts 30 in FIGS. 2A and 2B.

As shown in FIG. 2D, there is convective air flow 62 between several smaller apertures 18, the channel 22, and the distal end 20. This convective air flow 62 and the heat sink function to provide the necessary temperature differential across the Peltier modules 40, as described above.

As shown in FIG. 3, in a second embodiment, a flashlight, generally referred to as 110 is provided. The flashlight 110 is configured almost identically to the flashlight in FIG. 1.

The flashlight 110 has a first end 112, a second end 114 and a body 116 therebetween. The first end 114 defines a first aperture 118 and the second end 112 defines a second aperture 120. Housed within the body 116 is an inner cylinder 124 defining a first cooling channel 122 and a second cooling channel 126 between the body 116 and the inner cylinder 124. The first channel has a inside diameter of about 12 mm to about 30 mm, or 15 mm to about 25 mm or about 18 mm to about 29 mm and all ranges therebetween. It is about 150 mm long. As shown in FIGS. 4A, B, there are struts 130 between the inner cylinder 124 and the body 116 to retain the inner cylinder 124. FIG. 4A does not include the cooling fins 125 and FIGS. 4B and 4C are alternative embodiments that include the cooling fins 125. The inner cylinder extrusion can also be open as in FIG. 4C, with cooling fins 125 acting also as support against the body 148. The inner cylinder 124 is a heat conducting material, for example, but not limited to aluminum, steel, stainless steel, pyrolytic graphite, copper, diamond coated metal or diamond coated plastic polymer. It functions as a heat sink and has a thermal conductivity of at least about 16 W/mK at 25° C. or 175 W/mK at 25° C. or about 205 W/mK at 25° C. or about 400 W/mK at 25° C., and all ranges therebetween. The inner cylinder 124 is about 2 mm thick, to about 5 mm thick, or about 3 mm thick and all ranges therebetween. The following is a list of the thermal conductivity of a number of potential materials: Stainless Steel: Heat conduction 16 W/m K; Steel: Heat conduction 50 W/m K, Pyrolytic Graphite: Heat conduction 700-1750 W/m K, Silver: Heat conduction 400 W/m K, Copper: Heat conduction 385 W/m K, Aluminum: Heat conduction 205 W/m K and sandwiches including these and other materials.

Returning to FIG. 3, Peltier modules 140 are located on a plate 142 that is also a heat sink and is made of the materials listed above or has the functional capabilities listed above or alternatively is a heat conductive rubber or flexible plastic polymer. Four Peltier modules 140 are shown in FIG. 3. The plate 142 is located in a cutout 144 in the body 116. Plate 142 and cylinder 124 can also be one single extrusion. A heat conductive rubber or plastic polymeric material layer 170 is located on outer side 164 of the Peltier modules 140 for a user to press their head or any other suitable body part into. The body 116 has at least one insulating layer 146 and one supporting layer 148, for example, but not limited to foam and a Poly Vinyl Chloride (PVC) shell, respectively. The shell is about 32 mm OD, and about 29 mm ID, which leaves a 1.5 mm air gap around the inner cylinder 124. The insulating layer 146 may be a 1.5 mm thick, rubber foam or other materials such as, but not limited to leather, fabric, or wood. The heat conductivity is low, possible less than 1 W/m/K.

Circuitry 150 is housed within the headlamp 110. The circuitry 150 has a transistor oscillator 152, with a 10:1 or 25:1 or 500:1 or preferably a 100:1, and all ranges therebetween step-up transformer 154 to provide the required voltage and an about 47 μF decoupling capacitor 156, which may or may not be used. Alternatively, the circuitry may be an integrated circuit containing the transistor oscillator 152 and other components needed to generate DC or a pulsed DC power may be used. At least one LED 158 is in electrical communication with the circuitry 150. The LED or LEDs 158 can be oriented at any angle from the circuitry enclosure.

As shown in FIG. 3, there is convective air flow 162 in both the first channel 122 and the second channel 126. This convective air flow 162 and the heat sink function to provide the necessary temperature differential across the Peltier modules 140, as described above.

An alternative design of the flashlight for mounting on the head is shown in FIGS. 5A, B and 5C. The headlamp 210 has a half cylinder 224 with a first end 212, a second end 214, and a cooling channel 226 therebetween. The first end 214 defines a first aperture 218 and the second end 212 defines a second aperture 220. The half cylinder 224 has a inside diameter of about 12 mm to about 30 mm, or 15 mm to about 25 mm or about 18 mm to about 29 mm and all ranges therebetween. It is about 50 mm long. Plate 214 and cylinder 224 can also be one single extrusion. The cooling channel 226 has a series of cooling fins 225 therein. The half cylinder 224 is a heat conducting material, for example, but not limited to aluminum, pyrolytic graphite, copper, steel, stainless steel, diamond coated metal or diamond coated plastic polymer. It functions as a heat sink and has a thermal conductivity of at least about 16 W/mK at 25° C. or 175 W/mK at 25° C. or about 205 W/mK at 25° C. or about 400 W/mK at 25° C., and all ranges therebetween. The half cylinder 224 is about 1.5 mm thick, to about 5 mm thick, or about 3 mm thick and all ranges therebetween. The following is a list of the thermal conductivity of a number of potential materials: Stainless Steel: 16 W/K; Steel: Heat conduction 50 W/m K, Pyrolytic Graphite: Heat conduction 700-1750 W/m K, Silver: Heat conduction 400 W/m K, Copper: Heat conduction 385 W/m K, Aluminum: Heat conduction 205 W/m K and sandwiches including these and other materials.

Peltier modules 240 are located on the half cylinder 224 and a layer 270 of a heat conductive rubber or flexible plastic polymer may be on the outer side 264 of the Peltier modules 240 to facilitate thermal contact with the irregular shape of the head.

Circuitry 250 is housed within the headlamp 210. The circuitry 250 has a transistor oscillator 252, with a 10:1 or 25:1 or 500:1 or preferably a 100:1, and all ranges therebetween step-up transformer 254 to provide the required voltage and an about 47 μF decoupling capacitor 256, which may or may not be used. Alternatively, the circuitry may be an integrated circuit containing the transistor oscillator 252 and other components needed to generate DC or a pulsed DC power may be used. At least one LED 258 is located in the vicinity of the midline 259 of the half cylinder 224 and is in electrical communication with the circuitry 250. If multiple LEDs 258 are employed, they are centrally located in the vicinity of the midline 259. A strap 268 is attached to each end 212, 214 of the half cylinder 224. As shown in FIGS. 5A and C, apertures 272 along a front side 274 allow for further air flow. As shown in FIGS. 5A and C, the back 276 has a foam layer 246 on the surface not covered with the Peltier modules 240. As shown in FIG. 5C, a gooseneck 278 extends from the front 274 of the half cylinder 224 to allow the LED 258 to be positioned.

As shown in FIG. 5A, there is convective air flow 262 in the half cylinder 224. This convective air flow 262 and the heat sink function to provide the necessary temperature differential across the Peltier modules 240, as described above.

In yet another embodiment, a keychain flashlight 310 is provided, as shown in FIG. 6A and B. The keychain flashlight 310 is about 55 mm long, by about 20 mm wide, by about 7 mm thick. The flashlight 310 has a proximal end 312, a distal end 314 and a body 316 therebetween. The distal end 314 defines a distal aperture 318 and the proximal end 312 defines a proximal aperture 320. Housed within the body 316 is a cylinder 324 defining a cooling channel 322. The cylinder 324 is a heat conducting material, for example, but not limited to aluminum, copper, steel, stainless steel, diamond coated metal or diamond coated plastic polymer. It functions as a heat sink and has a thermal conductivity of at least about 16 W/mK at 25° C. or 175 W/mK at 25° C. or about 205 W/mK at 25° C. or about 400 W/mK at 25° C., and all ranges therebetween. The following is a list of the thermal conductivity of a number of potential materials: Stainless Steel: 16 W/K; Steel: Heat conduction 50 W/m K, Pyrolytic Graphite: Heat conduction 700-1750 W/m K, Silver: Heat conduction 400 W/m K, Copper: Heat conduction 385 W/m K, Aluminum: Heat conduction 205 W/m K and sandwiches including these and other materials.

Peltier modules 340 are located on a first side 376 in a cutout 344 in the body 316. The body 316 has at least one insulating layer 346 on the first side 376 of the keychain 310, and another on a second side 377. The insulating layer 346 may be a 1.5 mm thick, rubber foam or other materials such as, but not limited to leather, fabric, or wood. The layer may be perforated to allow for better cooling. The heat conductivity is low, possible less than 1 W/m/K.

Circuitry 350 is housed within the keychain 310. The circuitry 350 has a transistor oscillator 352, with a 10:1 or 25:1 or 500:1 or preferably a 100:1, and all ranges therebetween step-up transformer 354 to provide the required voltage and an about 47 μF decoupling capacitor 356, which may or may not be used. Alternatively, the circuitry may be an integrated circuit containing the transistor oscillator 352 and other components needed to generate DC or a pulsed DC power may be used. At least one LED 358 is located at the distal end 314 and is in electrical communication with the circuitry 350. The LED 358 is centrally located on the distal end 314, or, if multiple LEDs 358 are employed, they form a ring around the distal aperture 318. A keychain 380 is attached to a keychain aperture 382 in the proximal end 312.

Figure 6B:
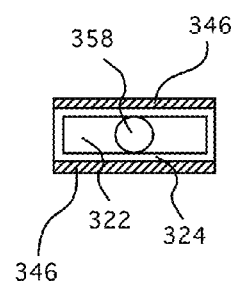
Figure 6C:
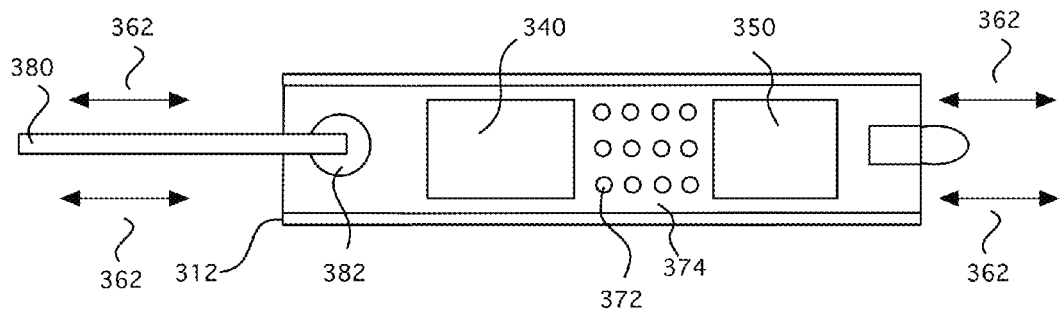

As shown in FIGS. 6A and 6B, there is convective air flow 362 in the channel 322. Additional apertures 372 along at least a second side 374 allow for further air flow. This convective air flow 362 and the heat sink function to provide the necessary temperature differential across the Peltier modules 340, as described above.

Figure 7A:
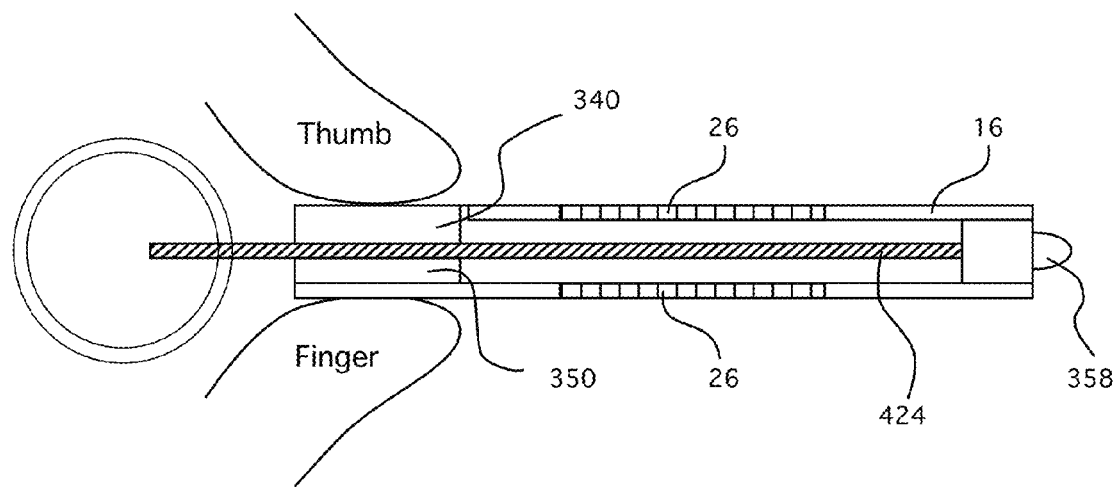
FIGS. 7A and 7B show a solid core heat sink for use in the present technology.
Figure 7B:
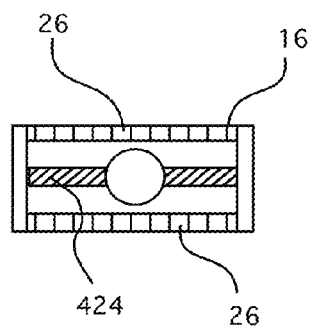

Whether a headlamp, keychain or flashlight, in another embodiment, the inner cylinder is replaced with a solid or perforated heat sink 424, as shown in FIGS. 7A and B, which may be round, oval, square, flattened or any suitable cross section. There is one cooling channel 26 between the body 16 and the solid or perforated heat sink 424 on each side of the headlamp or flashlight.

Figure 8E:
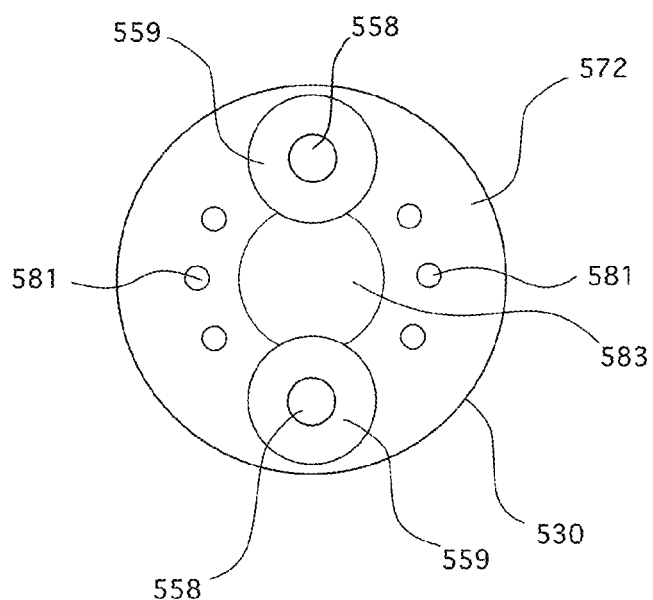
Figure 8F:
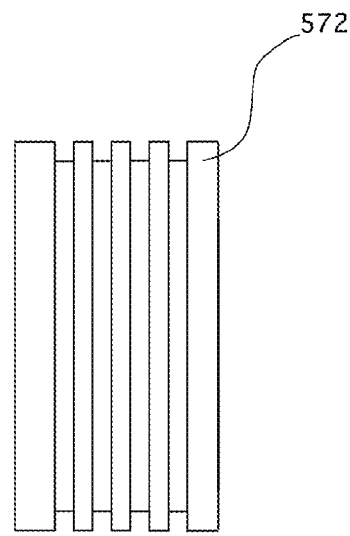
Figure 8G:
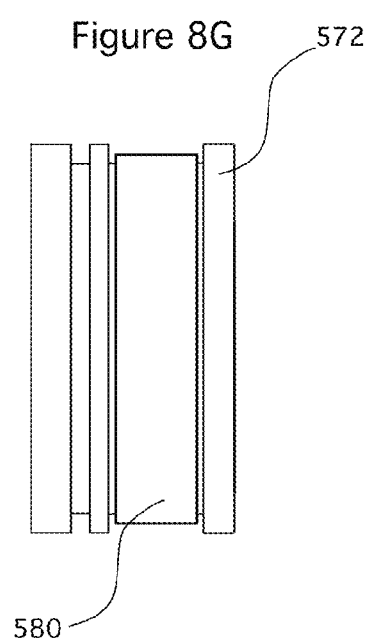
Figure 10:
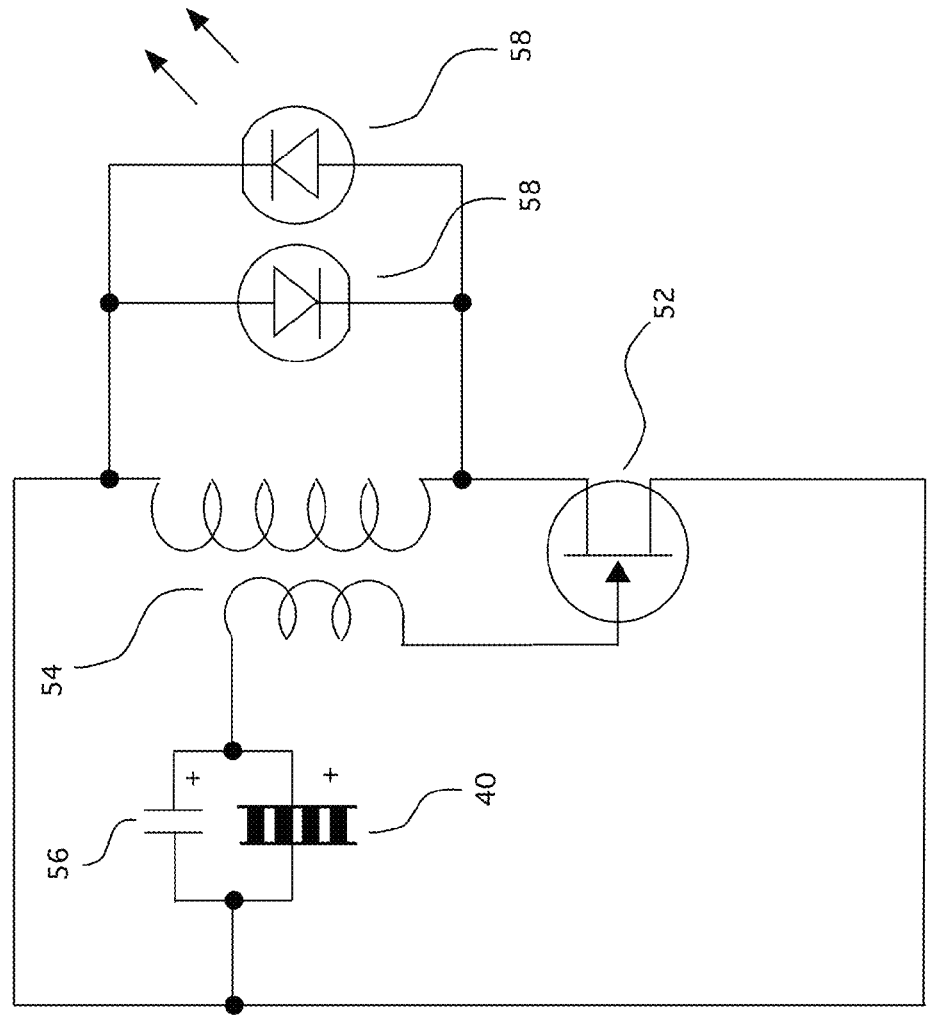
FIG. 10 shows the circuitry of the present technology.
Figure 11:
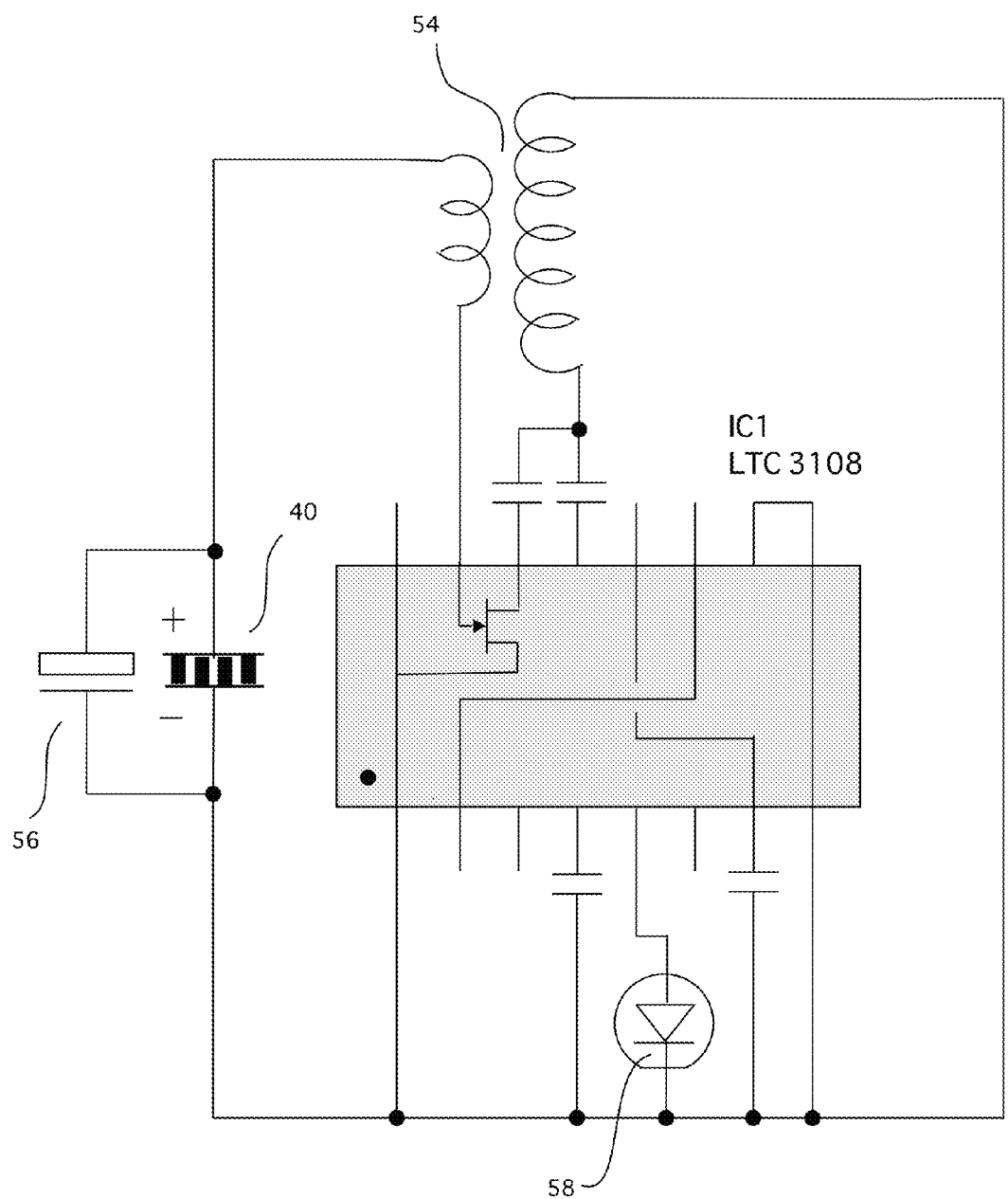
FIG. 11 shows an alternative circuitry of the present technology connected in a flashing mode.
Figure 12:
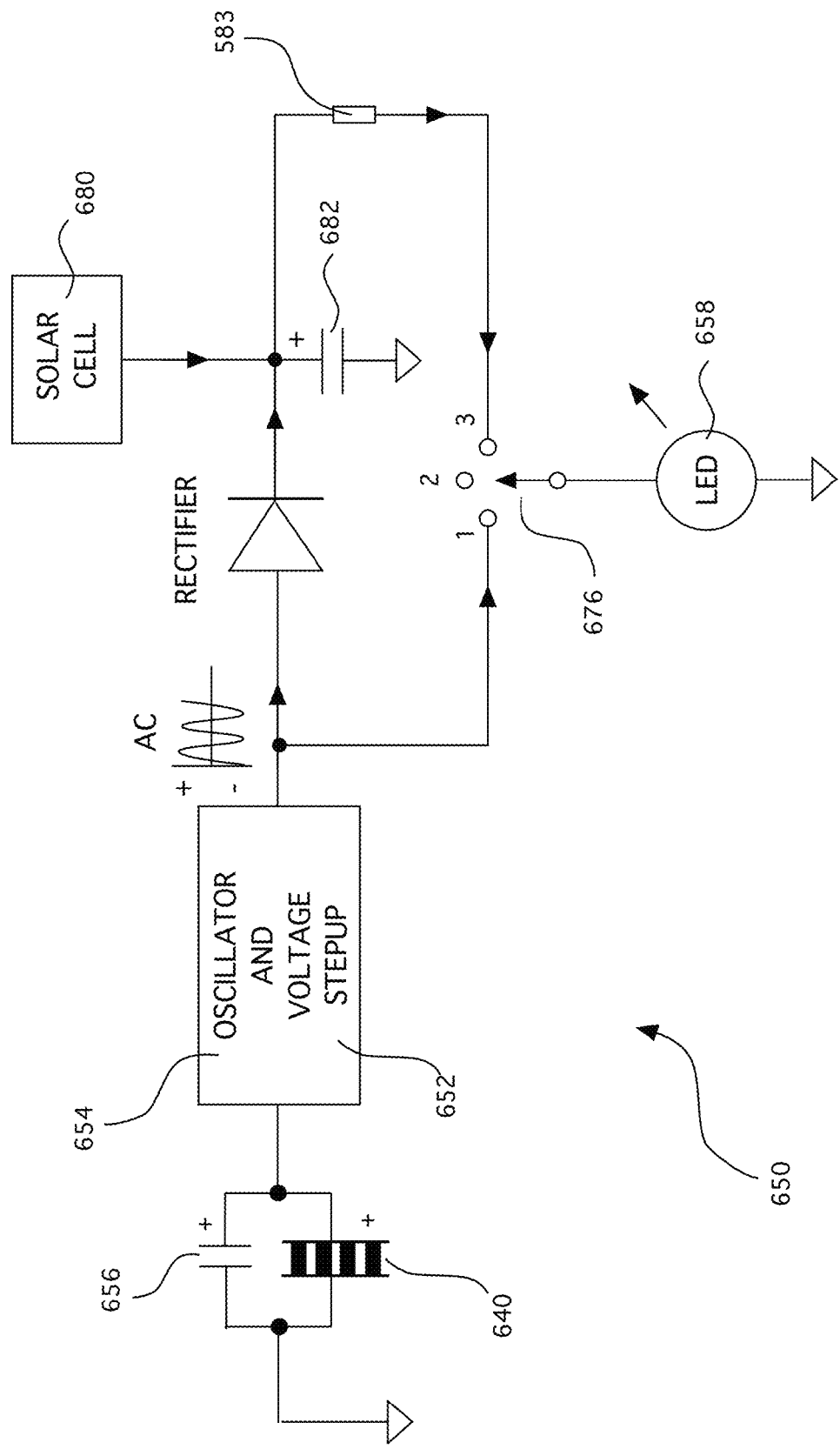
FIG. 12 shows an alternative circuitry of the present technology.
Figure 13:
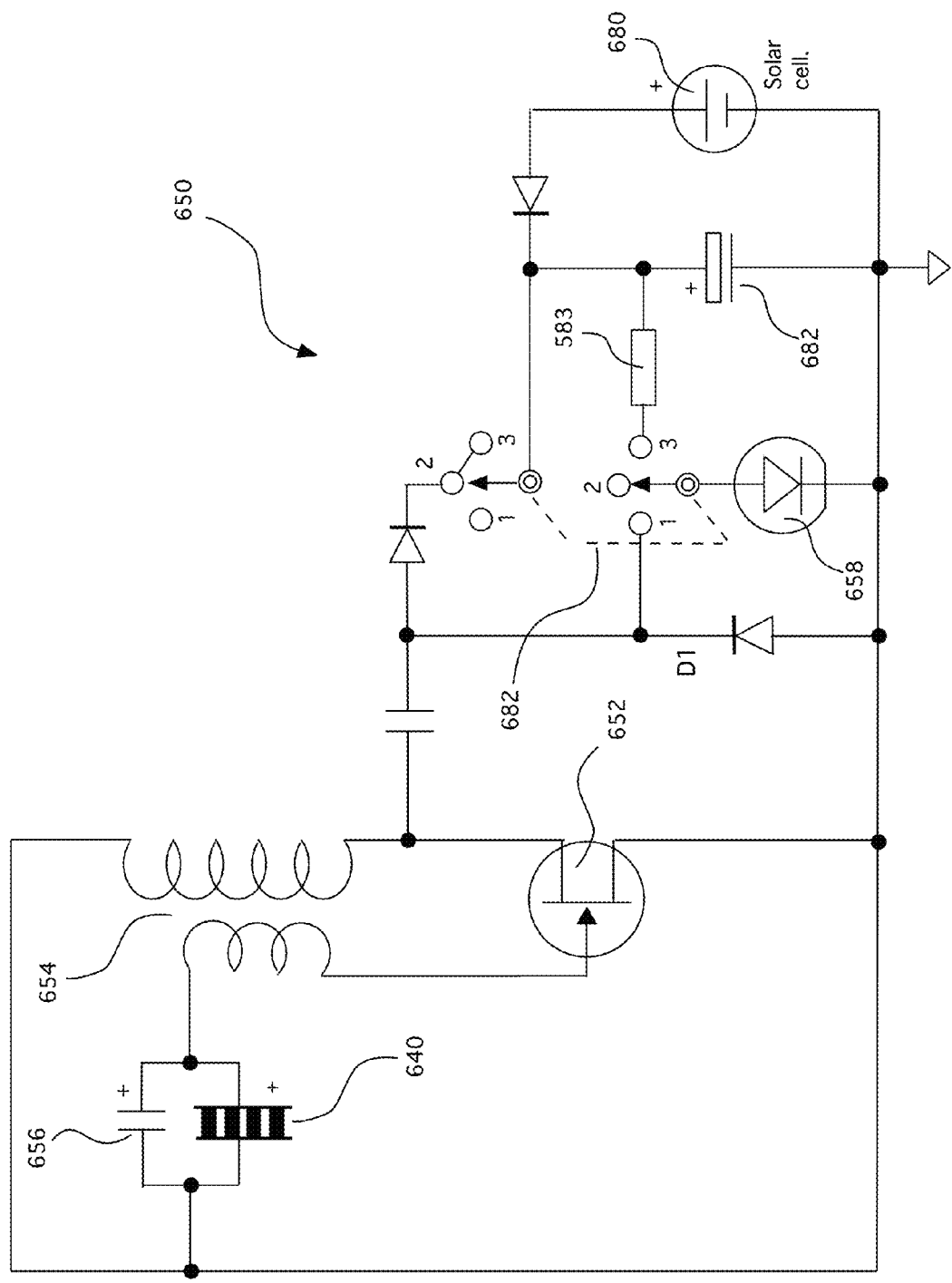
FIG. 13 shows an alternative circuitry of the present technology.

An alternative embodiment of the flashlight of FIGS. 1-2 is shown in FIGS. 8A, 8B, 8C and 8D. The flashlight, generally referred to as 510, has the dimensions of a typical flashlight. The flashlight 510 has a proximal end 512, a distal end 514 and a body 516 therebetween. The distal end 514 defines a distal aperture 518 and the proximal end 512 defines a proximal aperture 520. Housed within the body 516 is an inner cylinder 524 defining a first cooling channel 522 and a second cooling channel 526 between the body 516 and the inner cylinder 524. There are cooling fins 525 in the first cooling channel 522 (See FIGS. 8C and D). Plate 542 and cylinder 524 can also be one single extrusion. Notwithstanding the size recited above, the first channel 522 has an inside diameter 570 of about 12 mm to about 30 mm, or 15 mm to about 25 mm or about 18 mm to about 29 mm and all ranges therebetween. It is about 150 mm long. As shown in FIGS. 8B and 8C, there are struts 530 between the inner cylinder 524 and the body 516 to retain the inner cylinder 524. The inner cylinder extrusion can also be open as in FIG. 8C, with cooling fins 525 acting also as support against the body 548. FIG. 8B is an alternative embodiment that does not include the cooling fins. The inner cylinder 524 is a heat conducting material, for example, but not limited to aluminum, copper, steel, stainless steel, diamond coated metal or diamond coated plastic polymer. It functions as a heat sink and has a thermal conductivity of at least about 16 W/mK at 25° C. or about 175 W/mK at 25° C. or about 205 W/mK at 25° C. or about 400 W/mK at 25° C., and all ranges therebetween. The inner cylinder 524 is about 1.5 mm thick, to about 10 mm thick, or about 7 mm thick and all ranges therebetween. The following is a list of the thermal conductivity of a number of potential materials: Stainless Steel: Heat conduction 16 W/m K; Steel: Heat conduction 50 W/m K; Pyrolytic Graphite: Heat conduction 700-1750 W/m K, Silver: Heat conduction 400 W/m K, Copper: Heat conduction 385 W/m K, Aluminum: Heat conduction 205 W/m K and sandwiches including these and other materials.

Returning to FIGS. 8A, 8B and 8C, Peltier modules 540 are located on a plate 542 that is also a heat sink and is made of the materials listed above or has the functional capabilities listed above. One, two, three four or more Peltier modules 540 are shown in FIG. 1. The plate 542 is located in a cutout 544 in the body 516. The body 516 may have at least one insulating layer 546 and one supporting layer 548, for example, but not limited to foam and a Poly Vinyl Chloride (PVC) shell, respectively. The shell is about 32 mm OD, and about 29 mm ID, which leaves a 1.5 mm air gap around the inner cylinder 524. The insulating layer 546 may be a 1.5 mm thick, rubber foam or other materials such as, but not limited to leather, fabric, or wood. The heat conductivity is low, possible less than 1 W/m/K.

Circuitry 550 is housed within the flashlight 510. The circuitry 550 has a transistor oscillator 552, with a 10:1 or 25:1 or 500:1 or preferably a 100:1, and all ranges therebetween step-up transformer 554 to provide the required voltage and an about 47 μF decoupling capacitor 556, which may or may not be used. Alternatively, the circuitry may be an integrated circuit containing the transistor oscillator 552 and other components needed to generate DC or a pulsed DC power may be used. At least one LED 558 is located at the distal end 514 and is in electrical communication with the circuitry 550. The LED 558 is centrally located on the distal end 514, or, if multiple LEDs 558 are employed, they form a ring around the distal aperture 518, and can be seated in a reflector 559 as also show in FIG. 9A.

As shown in FIG. 8A, there is convective air flow 562 in both the first channel 522 and the second channel 526 which vents through large apertures 583 and small apertures 581 as seen in FIG. 9A. This convective air flow 562 and the heat sink function to provide the necessary temperature differential across the Peltier modules 540, as described below.

The flashlight 510 can include a strap 568, as shown in FIG. 1, for releasably attaching to a user's arm. In this case, the arm would provide the 37° C. surface.

The flashlight 510 has a ring 572 of heat conducting material, for example, but not limited to aluminum, copper, steel, stainless steel, diamond coated metal or diamond coated plastic polymer, which in the preferred embodiment is a grooved aluminum head 572. There is a grooved aluminum tail 574. Both physically attached to the inner tube 524. Without being bound to theory, this allows for further heat sinking.

An electronic circuit may have a three position switch 576 that allows a user to select whether the LED 558 is to be powered from the Peltier module 540, or from a storage capacitor 582, which can be, for example, but not limited to a battery or a supercapacitor. A flexible solar cell 580 is located on the aluminum head 572, on plate 542 or tail 574. A solid solar cell can be located on the plate 542, and is in electrical communication with the storage capacitor 582 and the LED 558.

In use, a user grasps the flashlight 510 such that their hand is on the Peltier module 540, more specifically, their palm. The temperature differential between the approximately 37° C. palm on the outer surface 564 of the Peltier module 540 and the inner surface 566 (FIG. 8B) of the Peltier module 540 generates sufficient power to light the LED 558, which appears from experimental results to be at least about 2 to about 5° C., with larger temperature differential providing more power and therefore a brighter light, for example, but not limited to, about 3° C. temperature range, or about a 6° C. temperature range or about a 10° C. temperature range or about a 12° C. temperature range or about a 14° C. temperature range. As would be known to one skilled in the art, the temperature range needed can be calculated once the parameters of the tile are known.

FIGS. 9A, 9B and 9C shows another alternative embodiment of the head lamp, generally referred to as 610. The headlamp 610 has a rectangular body 624 with a first end 612, with a first port 613 a second end 614, with a second port 615 and a cooling channel 626 therebetween. Bridges 627 extend across a part of the cooling channel 626 so as to not impede movement of air in the cooling channel 626. This improves heat conduction and cooling. The rectangular body 624 has a width of about 6 mm to about 30 mm, or 15 mm to about 25 mm or about 18 mm to about 29 mm and all ranges therebetween. It is about 150 mm long. A front side 641 has a series of cooling fins 625 thereon. The rectangular body 624 is a heat conducting material, for example, but not limited to aluminum, steel, stainless steel, pyrolytic graphite, copper, diamond coated metal or diamond coated plastic polymer. It functions as a heat sink and has a thermal conductivity of at least about 16 W/mK at 25° C. or 175 W/mK at 25° C. or about 205 W/mK at 25° C. or about 400 W/mK at 25° C., and all ranges therebetween. The body 624 is about 1 mm thick, to about 5 mm thick, or about 2 mm thick or about 3 mm thick and all ranges therebetween. The following is a list of the thermal conductivity of a number of potential materials: Stainless steel: Heat conduction 16 W/m K; Steel: Heat conduction 50 W/m K, Pyrolytic Graphite: Heat conduction 700-1750 W/m K, Silver: Heat conduction 400 W/m K, Copper: Heat conduction 385 W/m K, Aluminum: Heat conduction 205 W/m K and sandwiches including these and other materials.

Peltier modules 640 are located on the body 624 and a layer 670 of a heat conductive rubber or flexible plastic polymer may be on the outer side 664 of the Peltier modules 640.

Circuitry 650 is housed within the headlamp 610. The circuitry 650 has a transistor oscillator 652, with a 100:1 step-up transformer 654 to provide the required voltage and a 47 μF decoupling capacitor 656, which may or may not be used. At least one LED 658 is located in the vicinity of the midline 659 of the body 624 and is in electrical communication with the circuitry 650. A current limiting resistor 680 is in series with the LED. If multiple LEDs 658 are employed, they are centrally located in the vicinity of the midline 659. A strap 668 is attached to each end 612, 614 of the body 624. As shown in FIG. 9C, a gooseneck 678 extends from the front 274 of the body 624 to allow the LED 658 to be positioned.

As shown in FIG. 9A, there is convective air flow 662 in the body 624. This convective air flow 662 and the heat sink function to provide the necessary temperature differential across the Peltier modules 640, as described above.

An electronic circuit has a three position switch 676 that allows a user to select whether the LED 658 is to be powered from the Peltier module 640, or from a storage capacitor 682, which can be, for example, but not limited to a battery or a supercapacitor. The third switch position is set for charging only. A solar cell 680 is located on the cooling fin 618 and is in electrical communication with the storage capacitor 682 and the LED 658. The switch can be replaced by a suitable electronic circuit and a single button switch to switch between the three modes.

FIGS. 10 through 13 show the circuitry for the above embodiments.

Development of the Light Source

EXAMPLE 1

In order to determine the feasibility of using heat from the hand of a user to power a flashlight, calculations had to be performed. An average human dissipates around 350,000 Joules per hour, or 97 watts. The average surface area of the human skin is 1.7 m² or 17,000 cm², so the heat dissipation equals to (97/17000)*1000=5.7 mW/cm². A useful area of the palm is about 10 cm². This implies that 57 mW could be available. The thermal efficiency of a Peltier module is cited at about 6%, hence the palm of the hand may be able to generate 3.4 mW. At least 25 microwatts is needed to light an LED and about 100 microwatts is needed to obtain usable LED brightness.

EXAMPLE 2

The voltage and power generated by Peltier modules was determined. Tile 1 had an area of 1.36 cm² and an internal resistance of 5 ohms, and tile 2 was 4 cm² and had an internal resistance of 2.4 ohms. The tiles were heated on a first side and cooled on a second side, using a temperature difference ranging from about 1° C. to about 15° C. Table 1 shows the results for about a 5° C. differential and about a 10° C. differential.

The results show that both Peltier modules produced enough power through the power conversion circuit of the flashlight, to light an LED adequately, at between approximately 50 mV and about 100 mV.

EXAMPLE 3

As about 2500 mV is needed to light an LED, the voltage needed to be increased. A power converter integrated circuit (LTC3108 from Linear Technology™) was used as a three pin, very low transistor oscillator, with a 100:1 step-up transformer to provide the required voltage. These two components were coupled to a 47 μF capacitor to provide a circuit, which in turn was coupled to the LED. This provided good LED brightness with less than 50 mV DC input across the oscillator. The efficiency of the converter was about 10% at 50 mV. Using 5 mm, 15 degree LEDs, two systems were tested, as shown in Table 2. The step-up transformer can be about 100:1 or between about 25:1 and 500:1 and all ranges therebetween. The capacitor can be about 47 or about 10 μF to about 100 µF to about 1000 µF or about 1 µF to about 1000 µF, and all ranges therebetween.

When the power from the Peltier module is converted to alternating current by the oscillator, and then back to over 3 to 6 volts of direct current and stored in a supercapacitor or a secondary cell, the LED can then be switched so it is powered either directly from the LED or from the storage. The charge stored in a typical 1 Farad supercapacitor can power an LED for over 60 minutes and provide higher brightness that if powered directly from the Peltier module.

Measurements made at room temperature of 21° C. with a Tondai LX 1010B Digital Lux meter at a distance of 1 foot (30 cm) between the source and the meter, are shown in Table 3.

Advantages of the exemplary embodiments described herein may be realized and attained by means of the instrumentalities and combinations particularly pointed out in this written description. It is to be understood that the foregoing general description and the following detailed description are exemplary and explanatory only and are not restrictive of the claims below. While example embodiments have been described in detail, the foregoing description is in all aspects illustrative and not restrictive. It is understood that numerous other modifications and variations can be devised without departing from the scope of the example embodiment.

TABLE 1

| Peltier Module & Size | Voltage for 5° C. Temp Difference (mV) | Power for 5° C. Temp Difference (mW/cm²) | Voltage for 10° C. Temp Difference (mV) | Power for a 10° C. Temp Difference (mW/cm²) |
|---|---|---|---|---|
| Tile 1 (smaller) | 50.3 | 0.38 | 94.6 mV | 1.35 |
| Tile 2 (larger) | 50.3 | 0.26 | 73.7 mV | 0.56 |

TABLE 2

| Flashlight | Tile area (cm²) | Hand heat (mW/cm²) | Theoretical palm power (mW) | Tile Efficiency (Estimate %) | Power Conv. Effic. at 10° C. TΔ (%) | Actual Power at LED (mW) |
|---|---|---|---|---|---|---|
| F1 | 5.4 | ×5.7 | =30.8 | 10 | 10 | 0.7 |
| F2 | 16 | ×5.7 | =91 | 10 | 10 | 0.45 |

TABLE 3

| Flashlight | LED Brightness at 10° C. TΔ (Lux) |
|---|---|
| F1 | 8 |
| F2 | 11 |

While example embodiments have been described in connection with what is presently considered to be an example of a possible most practical and/or suitable embodiment, it is to be understood that the descriptions are not to be limited to the disclosed embodiments, but on the contrary, is intended to cover various modifications and equivalent arrangements included within the spirit and scope of the example embodiment. Those skilled in the art will recognize, or be able to ascertain using no more than routine experimentation, many equivalents to the specific example embodiments specifically described herein. Such equivalents are intended to be encompassed in the scope of the claims, if appended hereto or subsequently filed. For example, the system described herein could be used to power any portable device that has a power sink with an equivalent or lower power requirement. While four Peltier modules were used, as few as one and more than four could similarly be employed. The outer shell may be any suitable elongate shape, for example, but not limited to, square, oblong, round, or octagonal in cross section.

What is claimed is:

1. A portable, thermoelectrically powered device, the device comprising: a body defining an interior extending between an at least one first aperture at a distal end, and an at least one second aperture at a proximal end, the at least one first aperture and the at least one second aperture in communication with an ambient environment; a thermoelectric generator located on and extending inward through a portion of the body to the interior; a heat sink housed in the interior and in contact with an inner surface of the thermoelectric generator, the heat sink defining an internal first cooling channel extending between and continuous with the at least one first aperture and the at least one second aperture, the body and the heat sink defining a second cooling channel there-between, the second cooling channel extending between and continuous with the at least one first aperture and the at least one second aperture;

and circuitry in electrical communication with the thermoelectric generator, the circuitry comprising a transistor oscillator, a step-up transformer and a decoupling capacitor, the circuitry in electrical communication with a power sink, such that in use, a temperature gradient across the thermoelectric generator is sufficient to result in generation of at least 25 microwatts of power.

2. The device of claim 1, further comprising an at least one strut extending across the second cooling channel and retaining the heat sink in the body.

3. The device of claim 2, wherein the second cooling channel is defined by an air gap at least about 1.5 mm wide.

4. The device of claim 3, wherein the body includes a shell and an insulating layer.

5. The portable thermoelectrically powered device of claim 4, wherein the heat sink has a thermal conductivity of at least about 16 W/mK at 25° C.

6. The portable thermoelectrically powered device of claim 5, wherein the heat sink is an aluminum, copper, steel, stainless steel or pyrolytic graphite or a diamond coated substrate.

7. The portable thermoelectrically powered device of claim 6, wherein the power sink is at least one LED and the device is a light source.

8. The portable thermoelectrically powered device of claim 7, wherein the light source is a head lamp or a flashlight.

9. The portable thermoelectrically powered device of claim 8, wherein the light source is a flashlight.

10. The portable thermoelectrically powered device of claim 9, wherein the decoupling capacitor is about 47 μF or more.

11. A thermoelectrically powered light, the light comprising: at least one thermoelectric generator for extracting body heat from a user; a body defining an interior extending between a distal end and a proximal end, the interior in communication with an ambient environment; a thermoelectric generator located on and extending inward through a portion of the body to the interior; a heat sink housed in the interior and in contact with an inner surface of the thermoelectric generator, the heat sink defining an internal open-ended first cooling channel extending between the distal end and the proximal end and in communication with the ambient environment; and circuitry in electrical communication with the thermoelectric generator, the circuitry comprising a transistor oscillator, a step-up transformer and a decoupling capacitor, the circuitry in electrical communication with an at least one light emitting diode (LED).

12. The thermoelectrically powered light of claim 11, wherein the body and the heat sink define an internal open-ended second cooling channel extending between the distal end and the proximal end.

13. The thermoelectrically powered light of claim 12, further comprising an at least one strut extending across the internal open-ended second cooling channel and retaining the heat sink in the body.

14. The thermoelectrically powered light of claim 13, wherein the body includes a shell and an insulating layer.

15. The thermoelectrically powered light of claim 14, wherein the heat sink has a thermal conductivity of at least about 175 W/mK at 25° C.

16. The thermoelectrically powered light of claim 15, wherein the heat sink is an aluminum, copper, pyrolytic graphite or diamond coated inner cylinder.

17. The thermoelectrically powered light of claim 16, wherein the light is a headlamp or a flashlight.

18. A method of providing light, the method comprising: a user holding or pressing a thermoelectrically powered flashlight or body lamp against their body such that the body contacts at least one thermoelectric generator of the flashlight or body light, the flashlight or body lamp comprising: the at least one thermoelectric generator; a body defining an interior extending between an at least one first aperture at a distal end, and an at least one second aperture at a proximal end, the at least one first aperture and the at least one second aperture in communication with an ambient environment; a thermoelectric generator located on and extending through a portion of the body to an inner surface of the body; a heat sink housed in the interior and in contact with an inner surface of the thermoelectric generator, the heat sink defining an internal first cooling channel extending between and continuous with the at least one first aperture and the at least one second aperture; and circuitry in electrical communication with the thermoelectric generator, the circuitry comprising a transistor oscillator, a step-up transformer and a decoupling capacitor, the circuitry in electrical communication with an at least one LED; the thermoelectric generator extracting body heat from the user; the heat sink removing body heat from the thermoelectric generator; the thermoelectric generator producing heat energy;

and the circuitry communicating an electric current to at least one LED, thereby providing a steady or a flashing light.

19. The method of claim 18, further comprising storing the heat energy as a charge in a capacitor or battery of the flashlight or body light.

20. The method of claim 19, further comprising releasing the charge as the electric current.

* * * * *